United States Patent
Ikeda

(10) Patent No.: US 10,777,389 B2
(45) Date of Patent: Sep. 15, 2020

(54) PLASMA PROCESSING APPARATUS AND PLASMA PROCESSING METHOD

(71) Applicant: TOKYO ELECTRON LIMITED, Minato-ku, Tokyo (JP)

(72) Inventor: Taro Ikeda, Nirasaki (JP)

(73) Assignee: TOKYO ELECTRON LIMIED, Tokyo (JP)

( * ) Notice: Subject to any disclaimer, the term of this patent is extended or adjusted under 35 U.S.C. 154(b) by 381 days.

(21) Appl. No.: 15/456,894

(22) Filed: Mar. 13, 2017

(65) Prior Publication Data

US 2017/0263417 A1 Sep. 14, 2017

(30) Foreign Application Priority Data

Mar. 14, 2016 (JP) ................. 2016-049066

(51) Int. Cl.
*H01J 37/32* (2006.01)

(52) U.S. Cl.
CPC .... *H01J 37/3222* (2013.01); *H01J 37/32266* (2013.01); *H01J 37/32311* (2013.01); *H01J 37/32467* (2013.01); *H01J 37/32715* (2013.01); *H01J 2237/332* (2013.01); *H01J 2237/334* (2013.01)

(58) Field of Classification Search
CPC .......... H01J 37/32266; H01J 37/32715; H01J 7/3222; H01J 37/32467; H01J 2237/334; H01J 2237/332
See application file for complete search history.

(56) References Cited

U.S. PATENT DOCUMENTS

| | | | | |
|---|---|---|---|---|
| 6,177,148 B1* | 1/2001 | Walther | ................ | C23C 16/402 118/723 MW |
| 2001/0036465 A1* | 11/2001 | Ishll | .................. | H01J 37/32192 424/400 |
| 2003/0178143 A1* | 9/2003 | Perrin | ............... | H01J 37/32192 156/345.41 |
| 2003/0194508 A1* | 10/2003 | Carpenter | ......... | C23C 16/45525 427/569 |
| 2004/0029339 A1* | 2/2004 | Yamamoto | ........ | H01J 37/32192 438/222 |

(Continued)

FOREIGN PATENT DOCUMENTS

JP 2004247631 A 9/2004
JP 2010-140696 A 6/2010

(Continued)

*Primary Examiner* — Matthew J Song
(74) *Attorney, Agent, or Firm* — Nath, Goldberg & Meyer; Jerald L. Meyer

(57) ABSTRACT

There is provided a plasma processing apparatus including a microwave output part configured to generate microwaves and to distribute and output the microwaves to a plurality of paths, a microwave transmission part configured to transmit the microwaves outputted from the microwave output part into a process container via a plurality of transmission paths, and a control part configured to control the microwaves. The control part is configured to control the microwaves such that the phases of microwaves become different from each other when the microwaves transmitted via the transmission paths are introduced from a microwave transmitting plate for common use into the process container.

10 Claims, 7 Drawing Sheets

(56) References Cited

U.S. PATENT DOCUMENTS

| | | | |
|---|---|---|---|
| 2009/0078559 A1* | 3/2009 | Proudkii | B01D 17/0205 |
| | | | 204/157.15 |
| 2012/0090782 A1* | 4/2012 | Ikeda | H01J 37/32293 |
| | | | 156/345.28 |
| 2012/0247676 A1* | 10/2012 | Fujino | H01J 37/32211 |
| | | | 156/345.41 |
| 2014/0158302 A1* | 6/2014 | Ikeda | H01J 37/3222 |
| | | | 156/345.41 |
| 2015/0090708 A1* | 4/2015 | Tanaka | H01L 21/67115 |
| | | | 219/695 |

FOREIGN PATENT DOCUMENTS

| | | |
|---|---|---|
| JP | 2012089334 A | 5/2012 |
| JP | 2015-118739 A | 6/2015 |
| KR | 10-2012-0040677 A | 4/2012 |
| KR | 1020120112253 A | 10/2012 |
| KR | 1020150044821 A | 4/2015 |

* cited by examiner

PLASMA PROCESSING APPARATUS AND PLASMA PROCESSING METHOD

CROSS-REFERENCE TO RELATED APPLICATION

This application claims the benefit of Japanese Patent Application No. 2016-049066, filed on Mar. 14, 2016 in the Japan Patent Office, the disclosure of which is incorporated herein in its entirety by reference.

TECHNICAL FIELD

The present disclosure relates to a plasma processing apparatus and a plasma processing method for processing a workpiece with microwave plasma.

BACKGROUND

In the course of manufacturing a semiconductor device, for example, a film forming process such as an oxidizing process, a nitriding process or the like, an etching process, and the like are performed with respect to a workpiece such as a semiconductor wafer or the like through the use of plasma. Recently, there is an increasing demand for coping with miniaturization in an effort to develop a device for the next and subsequent generation. In the meantime, from the viewpoint of enhancing production efficiency, the size of a workpiece is growing larger.

As the related art regarding a plasma process, there has been proposed to provide a mode generation preventing part, which scatters or absorbs a surface wave in order to suppress mode jump of surface-wave-excited plasma.

Furthermore, there has been proposed a plasma processing apparatus in which microwave introduction mechanisms for introducing microwaves into a process container are provided at a plurality of locations. This apparatus is configured to avoid fixation of the positions of antinodes and nodes of a standing wave in the process container. For that purpose, the phases of the microwaves inputted to the microwave introduction mechanisms are adjusted so that, in the adjacent microwave introduction mechanisms, the microwave input phase of one introduction mechanism is fixed and the microwave input phase of the other introduction mechanism is changed according to a periodic waveform.

In a plasma processing apparatus that introduces a plurality of microwaves, in order to cope with the enlargement of a workpiece without unnecessarily increasing the number of microwave introduction regions, it is effective to use a large-sized microwave transmitting member and to share the microwave transmitting member with a plurality of microwaves. However, in the case of increasing the size of the microwave transmitting member, mode jump of plasma is likely to occur. This is because only the microwave having an integral multiple of a half wavelength exists in the interior of the microwave transmitting member so that the electron density of plasma generated by the corresponding microwave becomes a discontinuous value. When the mode jump of plasma occurs, the electron density of plasma is greatly changed. This adversely affects the homogenization of the processing on the workpiece.

SUMMARY

Some embodiments of the present disclosure provide a plasma processing apparatus and a plasma processing method for introducing microwaves into a process container, which are capable of effectively suppressing occurrence of mode jump of plasma even when a large microwave transmitting member is commonly used for a plurality of microwaves According to one embodiment of the present disclosure, there is provided a plasma processing apparatus including a process container configured to accommodate a workpiece, a mounting table disposed inside the process container and provided with a mounting surface configured to support the workpiece, a microwave output part configured to generate microwaves and to distribute and output the microwaves to a plurality of paths, a microwave transmission part configured to transmit the microwaves outputted from the microwave output part into the process container via a plurality of transmission paths, a microwave introduction part configured to radiate the microwaves transmitted by the microwave transmission part inside the process container, and a control part configured to control the microwave output part and the microwave transmission part. The microwave transmission part includes phase adjustment parts disposed in the respective transmission paths and configured to adjust phases of the microwaves, and tuner parts disposed in the respective transmission paths and configured to match impedance between the microwave output part and an interior of the process container. The microwave introduction part includes a conductive member constituting a ceiling portion of the process container and having a recess formed to face the mounting surface, a plurality of slots forming a part of the conductive member and configured to radiate the microwaves transmitted via the microwave transmission part, and a microwave transmitting plate fitted to the recess of the conductive member and configured to transmit and introduce the microwaves radiated through the plurality of slots into the process container. The control part is configured to control the microwaves such that the phases of the microwaves become different from each other when the microwaves transmitted via the transmission paths are introduced from the microwave transmitting plate for common use into the process container.

According to another embodiment of the present disclosure, there is provided a plasma processing method for processing a workpiece using a plasma processing apparatus including a process container configured to accommodate a workpiece, a mounting table disposed inside the process container and provided with a mounting surface configured to support the workpiece, a microwave output part configured to generate microwaves and to distribute and output the microwaves to a plurality of paths, a microwave transmission part configured to transmit the microwaves outputted from the microwave output part into the process container via a plurality of transmission paths, a microwave introduction part configured to radiate the microwaves transmitted by the microwave transmission part inside the process container, and a control part configured to control the microwave output part and the microwave transmission part. The microwave transmission part includes phase adjustment parts disposed in the respective transmission paths and configured to adjust phases of the microwaves, and tuner parts disposed in the respective transmission paths and configured to match impedance between the microwave output part and an interior of the process container. The microwave introduction part includes a conductive member constituting a ceiling portion of the process container and having a recess formed to face the mounting surface, a plurality of slots forming a part of the conductive member and configured to radiate the microwaves transmitted via the microwave transmission part, and a microwave transmitting plate fitted to the recess of the conductive member and configured to transmit and introduce the microwaves radiated through the plurality of slots into the process container. The microwaves are controlled such that the phases of the microwaves become different from each other when the microwaves transmitted via the transmission paths are introduced from the microwave transmitting plate for common use into the process container.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Configuration Example of Plasma Processing Apparatus]

Figure 1:
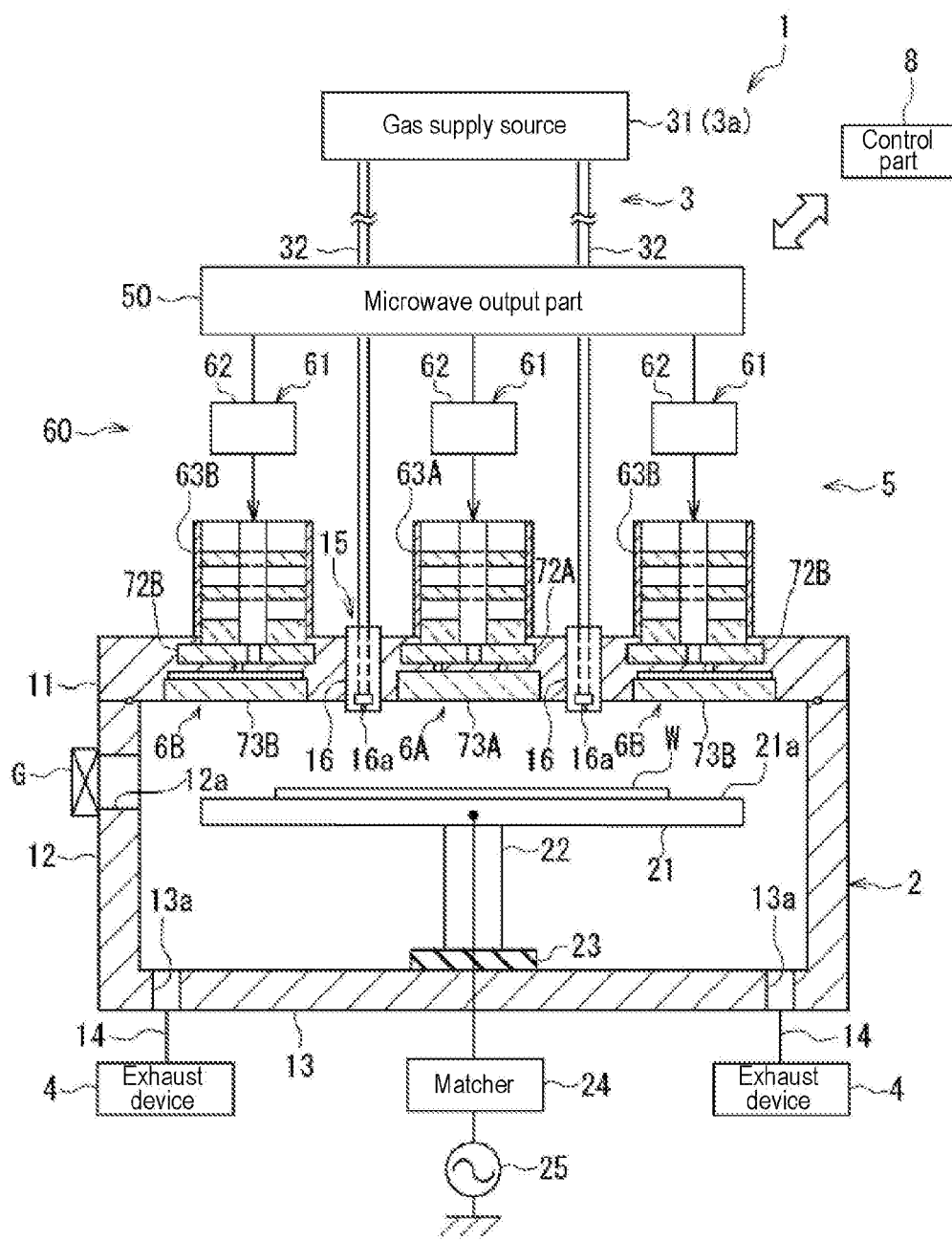
FIG. 1 is an explanatory view schematically showing the schematic configuration of a plasma processing apparatus according to one embodiment of the present disclosure.
Figure 2:
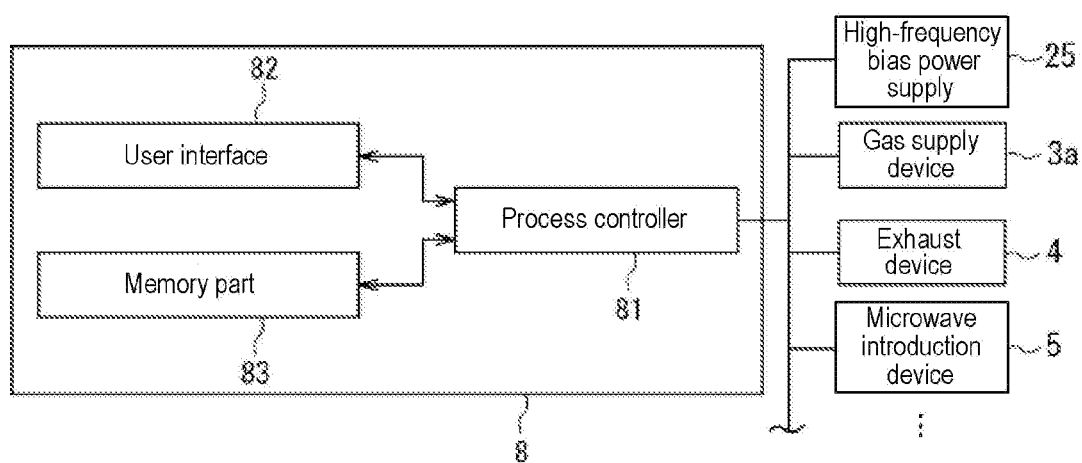
FIG. 2 is an explanatory diagram showing the configuration of a control part shown in FIG. 1.

First, a plasma processing apparatus according to one embodiment of the present disclosure will be described. FIG. 1 is sectional view schematically showing the schematic configuration of the plasma processing apparatus. FIG. 2 is an explanatory diagram showing the configuration of a control part shown in FIG. 1. The plasma processing apparatus 1 of the present embodiment is an apparatus that performs plasma processing upon a semiconductor wafer (hereinafter simply referred to as "wafer") W through a plurality of successive operations. In this regard, examples of the plasma processing may include a film forming process such as a plasma oxidizing process, a plasma nitriding process or the like, a plasma etching process, and the like.

The plasma processing apparatus 1 includes a process container 2 configured to accommodate a wafer W as a workpiece, a mounting table 21 disposed inside the process container 2 and having a mounting surface 21a on which the wafer W is mounted, a gas supply mechanism 3 configured to supply a gas into the process container 2, an exhaust device 4 configured to depressurize and exhaust the interior of the process container 2, a microwave introduction device 5 configured to generate microwaves for generating plasma inside the process container 2 and to introduce the microwaves into the process container 2, microwave introduction parts 6A and 6B configured to radiate the microwaves from the microwave introduction device 5 into the process container 2, and a control part 8 configured to control the respective configuring parts of the plasma processing apparatus 1. Instead of the gas supply mechanism 3, an external gas supply mechanism not included in the configuration of the plasma processing apparatus 1 may be used as a part for supplying a gas into the process container 2.

<Process Container>

The process container 2 has, for example, a substantially cylindrical shape. The process container 2 is made of, for example, a metallic material such as aluminum and its alloy. The microwave introduction device 5 is installed above the process container 2 and functions as a plasma generation part configured to generate plasma by introducing electromagnetic waves (microwaves) into the process container 2. The configuration of the microwave introduction device 5 will be described later in detail.

The process container 2 includes a plate-like ceiling portion 11, a bottom portion 13, and a sidewall portion 12 configured to connect the ceiling portion 11 and the bottom portion 13. The ceiling portion 11 has a plurality of recesses and functions as a conductive member constituting the microwave introduction parts 6A and 6B. The sidewall portion 12 has a loading/unloading gate 12a through which the wafer W is loaded and unloaded between the process container 2 and a transfer chamber (not shown) adjacent to the process container 2. A gate valve G is disposed between the process container 2 and the transfer chamber (not shown). The gate valve G has a function of opening and closing the loading/unloading gate 12a. The gate valve G hermetically seals the process container 2 in a closed state and allows the wafer W to transfer between the process container 2 and the transfer chamber (not shown) in an open state.

The bottom portion 13 has a plurality of (two, in FIG. 1) exhaust ports 13a. The plasma processing apparatus 1 further includes an exhaust pipe 14 that connects the exhaust ports 13a and the exhaust device 4. The exhaust device 4 includes an APC valve and a high-speed vacuum pump capable of depressurizing the internal space of the process container 2 at a high speed to a predetermined degree of vacuum. Examples of such a high-speed vacuum pump may include a turbo molecular pump and the like. By operating the high-speed vacuum pump of the exhaust device 4, the internal space of the process container 2 is depressurized to a predetermined degree of vacuum, for example, 0.133 Pa.

<Mounting Table>

The mounting table 21 is configured to horizontally support a wafer W as a workpiece. The plasma processing apparatus 1 further includes a support member 22 configured to support the mounting table 21 in the process container 2 and an insulating member 23 made of an insulating material and provided between the support member 22 and the bottom portion 13 of the process container 2. The support member 22 has a cylindrical shape extending from the center of the bottom portion 13 toward the internal space of the process container 2. The mounting table 21 and the support member 22 are made of, for example, AlN or the like.

The plasma processing apparatus 1 further includes a high-frequency bias power supply 25 configured to supply high frequency power to the mounting table 21 and a matcher 24 provided between the mounting table 21 and the high-frequency bias power supply 25. The high-frequency bias power supply 25 supplies high frequency power to the mounting table 21 in order to draw ions into the wafer W.

Although not shown in the drawings, the plasma processing apparatus 1 further includes a temperature control mechanism configured to heat or cool the mounting table 21. For example, the temperature control mechanism controls the temperature of the wafer W within a range of 20 degrees C. (room temperature) to 900 degrees C. Furthermore, the mounting table 21 includes a plurality of support pins provided to be protrudable with respect to the mounting surface 21a. The support pins are vertically displaced by an arbitrary elevator mechanism so that the wafer W can be delivered to and from the transfer chamber (not shown) when the support pins are in a raised position.

The plasma processing apparatus 1 further includes a gas introduction part 15 provided in the ceiling portion 11 of the process container 2. The gas introduction part 15 includes a plurality of nozzles 16 having a cylindrical shape. Each of the nozzles 16 has a gas hole 16a formed on its lower surface.

<Gas Supply Mechanism>

The gas supply mechanism 3 includes a gas supply device 3a including a gas supply source 31, and a pipe 32 configured to connect the gas supply source 31 and the gas introduction part 15. Although FIG. 1 shows a single gas supply source 31, the gas supply device 3a may include a plurality of gas supply sources depending on the type of gases to be used.

The gas supply source 31 is used, for example, as a gas supply source of a rare gas for plasma generation or a gas supply source of a process gas used for an oxidizing process, a nitriding process, an etching process or the like. There may be a case where a rare gas is used together with a process gas for an oxidizing process, a nitriding process, an etching process or the like.

Although not shown in the drawings, the gas supply device 3a further includes a mass flow controller and an opening/closing valve provided in the middle of the pipe 32. The type of gases to be supplied into the process container 2, the flow rate of these gases, and the like are controlled by the mass flow controller and the opening/closing valve.

<Control Part>

The respective components of the plasma processing apparatus 1 are connected to the control part 8 and controlled by the control part 8. The control part 8 is typically a computer. In the example shown in FIG. 2, the control part 8 includes a process controller 81 provided with a CPU, and a user interface 82 and a memory part 83, which are connected to the process controller 81.

In the plasma processing apparatus 1, the process controller 81 is a control part for generally controlling the respective components (for example, the high-frequency bias power supply 25, the gas supply device 3a, the exhaust device 4, the microwave introduction device 5, etc.) related to process conditions such as, for example, a temperature, a pressure, a gas flow rate, high frequency power for bias application, a microwave output, and the like.

The user interface 82 includes a keyboard or a touch panel through which a process manager performs an input manipulation of commands in order to manage the plasma processing apparatus 1, a display configured to visually display the operating status of the plasma processing apparatus 1, and the like.

The memory part 83 stores control program (software) for realizing various processes executed by the plasma processing apparatus 1 under the control of the process controller 81, a recipe in which process condition data and the like are recorded, and the like. The process controller 81 calls an arbitrary control program or recipe from the memory part 83 and executes the same according to necessity such as an instruction from the user interface 82. As a result, under the control of the process controller 81, a desired process is performed in the process container 2 of the plasma processing apparatus 1.

The control program and recipe may be used in a state stored in a computer-readable storage medium such as a CD-ROM, a hard disk, a flexible disk, a flash memory, a DVD, a Blu-ray disk, or the like. In addition, it may be possible to use the recipe on-line by frequent transmission from other devices via, for example, a dedicated line.

<Microwave Introduction Device and Microwave Introduction Part>

Figure 3:
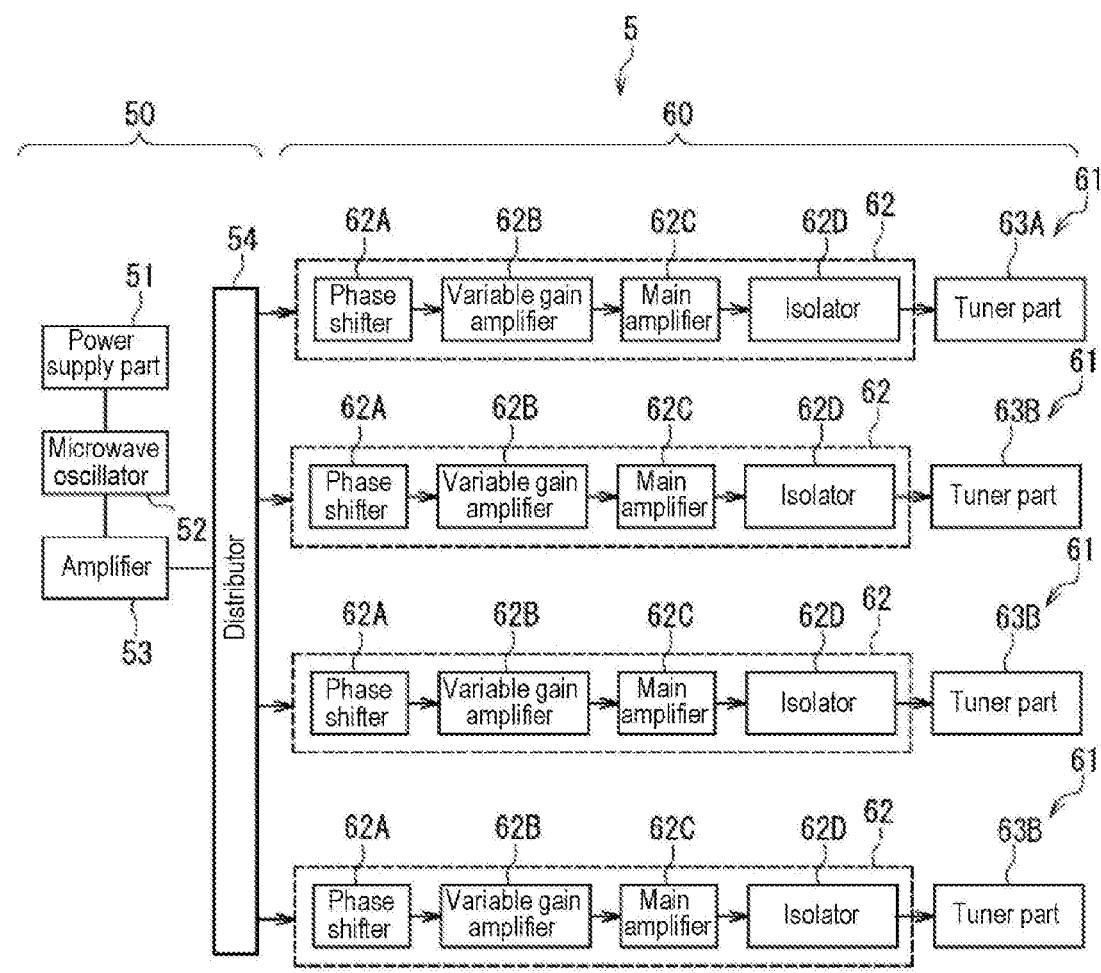
FIG. 3 is an explanatory diagram showing the configuration of a microwave introduction device shown in FIG. 1.
Figure 4:
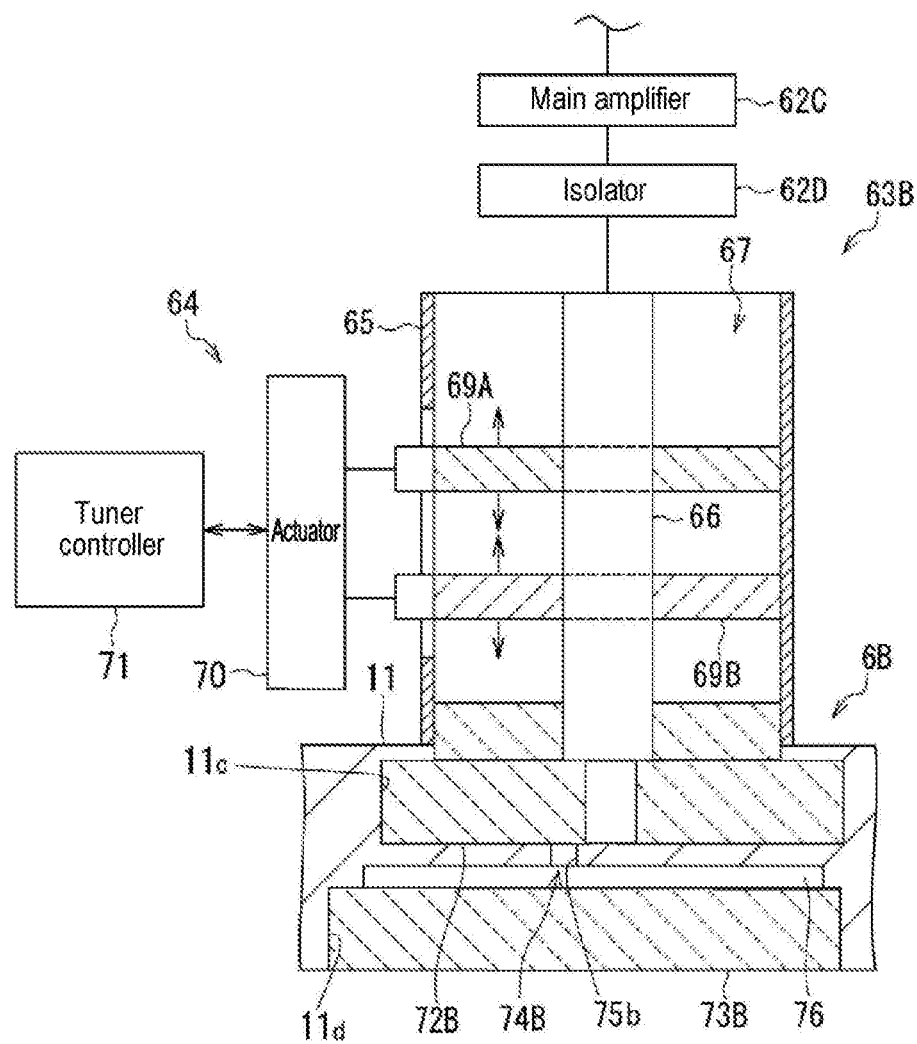
FIG. 4 is a sectional view showing the configurations of a tuner part and a microwave introduction part.
Figure 5:
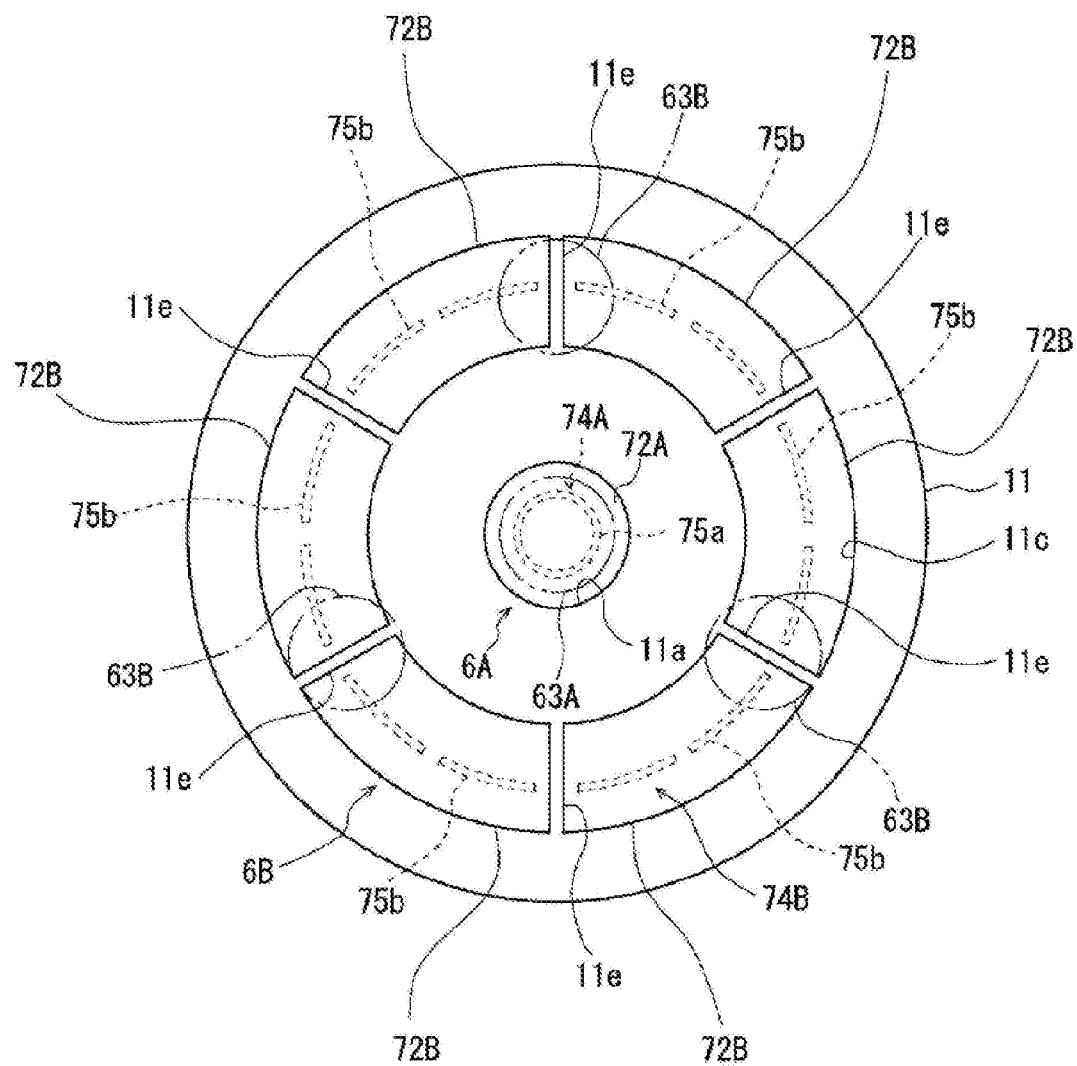
FIG. 5 is a plan view showing the configuration of an upper portion of the microwave introduction part.
Figure 6:
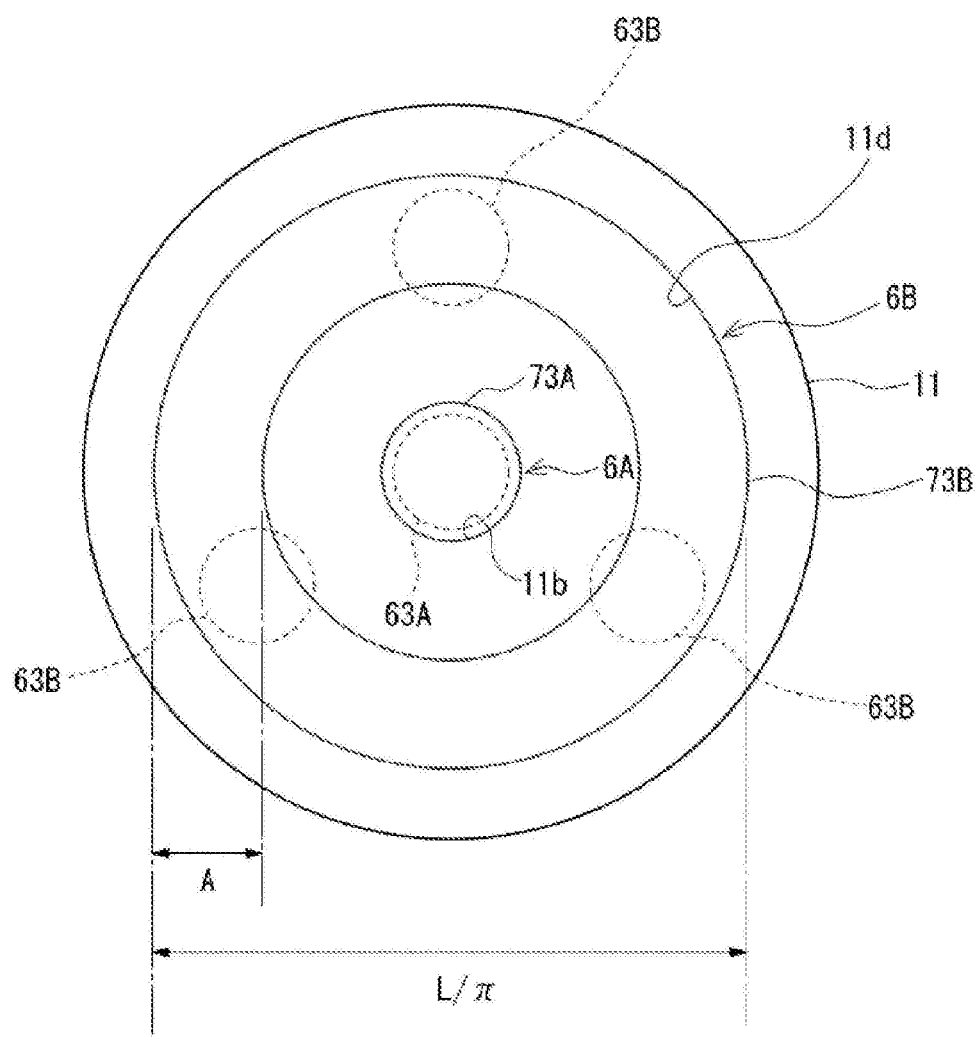
FIG. 6 is a plan view showing the configuration of a lower portion of the microwave introduction part.

Next, the configurations of the microwave introduction device 5 and the microwave introduction parts 6A and 6B will be described in detail with reference to FIG. 1 and FIGS. 3 to 6. FIG. 3 is an explanatory diagram showing the configuration of the microwave introduction device 5. FIG. 4 is a sectional view showing the configurations of the tuner part 63B and the microwave introduction part 6B which form a part of the microwave introduction device 5. FIG. 5 is a plane view showing the configurations of the microwave introduction parts 6A and 6B as viewed from above the ceiling portion 11. FIG. 6 is a plane view showing the configurations of the microwave introduction parts 6A and 6B as viewed from below the ceiling portion 11.

<Microwave Introduction Device>

As described above, the microwave introduction device 5 is provided above the process container 2 and functions as a plasma generation part configured to generate plasma by introducing electromagnetic waves (microwaves) into the process container 2. As shown in FIGS. 1 and 3, the microwave introduction device 5 includes a microwave output part 50 configured to generate microwaves and to distribute and output the microwaves to a plurality of paths, and a microwave transmission part 60 configured to transmit the microwaves outputted from the microwave output part 50 to the process container 2.

(Microwave Output Part)

The microwave output part 50 includes a power supply part 51, a microwave oscillator 52, an amplifier 53 configured to amplify the microwaves oscillated by the microwave oscillator 52, and a distributor 54 configured to distribute the microwaves amplified by the amplifier 53 to a plurality of paths. The microwave oscillator 52 oscillates microwaves (for example, PLL-oscillation) at a predetermined frequency (for example, 860 MHz). The frequency of the microwaves is not limited to 860 MHz but may be 2.45 GHz, 8.35 GHz, 5.8 GHz, 1.98 GHz, or the like. The distributor 54 distributes the microwaves while matching the impedances on the input side and the output side.

(Microwave Transmission Part)

The microwave transmission part 60 includes a plurality of antenna modules 61. The antenna modules 61 are respectively configured to introduce the microwaves distributed by the distributor 54 into the process container 2. Each of the antenna modules 61 includes an amplifier part 62 configured to mainly amplify and output the distributed microwaves and a tuner part 63A or 63B configured to adjust the impedance of the microwaves outputted from the amplifier part 62.

In the present embodiment, all the amplifier parts 62 of the antenna modules 61 have the same configuration. The amplifier part 62 includes a phase shifter 62A serving as a phase adjusting part to change the phase of the microwaves, a variable gain amplifier 62B configured to adjust the power level of the microwaves inputted to a main amplifier 62C, a main amplifier 62C configured as a solid state amplifier, and an isolator 62D configured to isolate reflected microwaves which are reflected by a slot antenna portion of the microwave introduction part 6A or 6B to be described later and are moved toward the main amplifier 62C.

As shown in FIG. 1, the tuner parts 63A and 63B are provided in the ceiling portion 11. In the present embodiment, the tuner part 63A is provided in the central region of the ceiling portion 11 and three tuner parts 63B (only two of which are shown in FIG. 1) are provided in the peripheral region of the ceiling portion 11. The three tuner parts 63B are equally arranged at an angle of 120 degrees in the circumferential direction so as to surround the tuner part 63. FIG. 4 representatively shows the configuration of one tuner part 63B disposed in the upper portion of the peripheral region of the ceiling portion 11. The tuner part 63A disposed in the upper portion of the central region of the ceiling portion 11 has the same configuration.

Each of the tuner parts 63A and 63B includes a slug tuner 64 configured to match the impedance, a main body container 65 made of a metallic material and having a cylindrical shape extending in the vertical direction in FIG. 4, and an inner conductor 66 extending in the same direction as the direction that the main body container 65 extends within the main body container 65. The main body container 65 and the inner conductor 66 constitute a coaxial tube. The main body container 65 constitutes an outer conductor of the coaxial tube. The inner conductor 66 has a rod-like shape or a tubular shape. A space between the inner circumferential surface of the main body container 65 and the outer circumferential surface of the inner conductor 66 forms a microwave transmission path 67.

As shown in FIG. 4, the slug tuner 64 includes two slugs 69A and 69B arranged in the base end side (upper end side) portion of the main body container 65, an actuator 70 configured to actuate the two slugs 69A and 69B, and a tuner controller 71 configured to control the actuator 70.

The slugs 69A and 69B have a plate-like annular shape and are disposed between the inner circumferential surface of the main body container 65 and the outer circumferential surface of the inner conductor 66. Furthermore, the slugs 69A and 69B are made of a dielectric material. As the dielectric material for forming the slugs 69A and 69B, it may be possible to use, for example, high-purity alumina having a relative dielectric constant of 10.

The slug tuner 64 moves the slugs 69A and 69B in the vertical direction using the actuator 70 based on a command from the tuner controller 71. As a result, the slug tuner 64 adjusts the impedance. For example, the tuner controller 71 adjusts the positions of the slugs 69A and 69B so that the impedance of a terminal portion becomes 50Ω.

In the present embodiment, the main amplifier 62C, the slug tuner 64 and the slot antenna portion 74A or 74B (to be described later) of the microwave introduction part 6A or 6B are arranged close to each other. In particular, the slug tuner 64 and the slot antenna portion 74A or 74B constitute a lumped constant circuit and further function as a resonator. The impedance mismatch can be highly accurately resolved up to the slot antenna portion 74A or 74B by the slug tuner 64, so that the substantially mismatched part can be used as a plasma space. As a result, plasma can be highly accurately controlled by the slug tuner 64.

In the tuner parts 63A and 63B configured as described above, the microwaves amplified by the main amplifier 62C are transmitted to the microwave introduction parts 6A and 6B through a space between the inner circumferential surface of the main body container 65 and the outer circumferential surface of the inner conductor 66 (the microwave transmission path 67).

<Microwave Introduction Part>

The microwave introduction parts 6A and 6B are provided in the ceiling portion 11. In the present embodiment, the microwave introduction parts 6A and 6B include a microwave introduction part 6A provided in the central region of the ceiling portion 11 and a microwave introduction part 6B provided in the peripheral region of the ceiling portion 11. The microwave introduction part 6A includes a part of the ceiling portion 11, a microwave retardation member 72A, a slot antenna portion 74A, and a microwave transmitting plate 73A. The microwave introduction part 6B includes a part of the ceiling portion 11, microwave retardation members 72B, a slot antenna portion 74B, and a microwave transmitting plate 73B. The microwave introduction part 6A and the microwave introduction part 6B slightly differ in configuration from each other as described below.

(Microwave Introduction Part in Central Region)

As shown in FIG. 5, at the upper portion of the central region of the ceiling portion 11, a recess 11a is formed in a region vertically overlapping with the arrangement region of the tuner part 63A. A disc-shaped microwave retardation member 72A is fitted to the recess 11a. As shown in FIG. 6, on the lower surface of the central region of the ceiling portion 11, a recess 11b is formed in a region vertically overlapping the microwave retardation member 72A. A disc-shaped microwave transmitting plate 73A is fitted to the recess 11b. A slot antenna portion 74A is formed between the lower portion of the microwave retardation member 72A and the microwave transmitting plate 73A. A slot 75a is formed in the slot antenna portion 74A.

The slot antenna portion 74A mode-converts the microwaves transmitted from the tuner part 63A as TEM waves into TE waves using the slot 75a and radiates the microwaves into the process container 2 via the microwave transmitting plate 73A. The shape and size of the slot 75a are appropriately adjusted so that the uniform electric field intensity can be obtained without causing mode jump. For example, the slot 75a is formed in a ring shape as shown in FIG. 5. As a result, no joint exists in the slot 75a, a uniform electric field can be formed, and mode jump is hard to occur.

(Microwave Introduction Part in Peripheral Region)

As shown in FIGS. 4 and 5, on the upper portion of the peripheral region of the ceiling portion 11, a recess 11c is formed along a ring-shaped region vertically overlapping with the arrangement region of the tuner part 63B, and a plurality of microwave retardation members 72B is fitted to the recess 11c. As shown in FIGS. 4 and 6, on the lower surface of the peripheral region of the ceiling portion 11, a recess 11d is formed in a ring-shaped region vertically overlapping with the arrangement region of the tuner part 63B, and a microwave transmitting plate 73B is fitted to the recess 11d. As shown in FIG. 4, a slot antenna portion 74B and a plurality of dielectric layers 76 are formed between the microwave retardation members 72B and the microwave transmitting plate 73B.

As shown in FIG. 5, each of the microwave retardation members 72B has an arcuate shape and the plurality of the microwave retardation members 72B is arranged so as to form a ring shape. The number of the microwave retardation members 72B is twice as many as the number of the tuner parts 63B. For example, six microwave retardation members 72B are provided in the present embodiment. These microwave retardation members 72B are provided at equal intervals. The adjacent microwave retardation members 72B are separated by a partition portion 11e forming a part of the ceiling portion 11, which is a conductive member. For example, in the region vertically overlapping with the three tuner parts 63B, the partition portion 11e is inserted between the adjacent microwave retardation members 72B from the lower side, whereby the adjacent microwave retardation members 72B are separated from each other.

As shown in FIG. 5, the tuner parts 63B are disposed above the two microwave retardation members 72B so as to straddle therebetween. That is to say, the two microwave retardation members 72B adjacent to each other are arranged on both sides of one tuner part 63B so as to extend in the circumferential direction from the position vertically overlapping with one tuner part 63B. Since the partition portion 11e is disposed immediately below the tuner part 63B, the microwave electric power transmitted through the tuner part 63B is divided by the partition portion 11e and is evenly distributed to the microwave retardation members 72B existing on both sides of the tuner part 63B. Therefore, the microwave electric power is evenly distributed to the microwave retardation members 72B existing on both sides of the tuner part 63B without increasing the electric field intensity in the region immediately below the tuner part 63B, in which a microwave electric field normally tends to become large. Thus, the electric field intensity in the circumferential direction is brought into uniformity.

The microwave transmitting plate 73B is made of a dielectric material which transmits microwaves. As shown in FIG. 6, the microwave transmitting plate 73B has a ring shape. With such a shape, the microwaves transmitted through the three tuner parts 63B are radiated into the process container 2 through one common microwave transmitting plate 73B to form uniform surface wave plasma in the circumferential direction.

The slot antenna portion 74B is a constituent part of the ceiling portion 11, which is a conductive member, and has a flat plate shape. The slot antenna portion 74B mode-converts the microwaves transmitted from the tuner parts 63B as TEM waves into TE waves by slots 75b and radiates the microwaves into the process container 2 via the microwave transmitting plate 73B.

As shown in FIG. 4, the slots 75b are formed as holes which extend through the ceiling portion 11 from the upper surface position making contact with the microwave retardation member 72B to the lower surface position making contact with the dielectric layer 76. The slots 75b determine the radiation characteristics of the microwaves transmitted from the tuner parts 63B. The periphery of each of the slots 75b is sealed by a seal member (not shown). As a result, the microwave transmitting plate 73B covers and closes the slots 75b and functions as a vacuum seal. The antenna directivity is determined by the shape and arrangement of the slots 75b. The slots 75b have an arcuate shape. In order to evenly distribute the electric field, the slots 75b are provided along the arrangement regions of the tuner parts 63B such that the entire shape thereof becomes a circumferential shape. As shown in FIG. 5, in the present embodiment, twelve arcuate slots 75b are arranged in a line in the circumferential direction along the arrangement regions of the tuner parts 63B.

Furthermore, two slots 75b are provided for each microwave retardation member 72B. The circumferential length of one slot 75b is preferably $\lambda/2$. $\lambda$ is the effective wavelength of the microwaves and may be represented by the following equation:

$$\lambda \approx (\lambda_0/\varepsilon_s^{1/2}) / \{1 - [(\lambda_0/\varepsilon_s^{1/2})/\lambda_c]^2\}^{1/2},$$

where $\varepsilon_s$ denotes the relative permittivity of a dielectric material filled in the slots 75b, $\lambda_0$ denotes the wavelength of microwaves in vacuum, and $\lambda_c$ denotes the cutoff frequency.

As shown in FIG. 4, a plurality of dielectric layers 76 is provided in a corresponding relationship with each of the slots 75b. In this example, twelve dielectric layers 76 are provided in a corresponding relationship with the twelve slots 75b. The dielectric layers 76 adjoining each other are separated by the metal-made ceiling portion 11. In each of the dielectric layers 76, a magnetic field of a single loop can be formed by the microwaves radiated from the corresponding slot 75b, so that the coupling of a magnetic field loop does not occur in the microwave transmitting plate 73B disposed under the dielectric layers 76. Thus, it is possible to prevent the advent of a plurality of surface wave modes, thereby realizing a single surface wave mode. From the viewpoint of preventing the advent of a plurality of surface wave modes, it is preferred that the circumferential length of each of the dielectric layers 76 is not more than $\lambda/2$, where $\lambda$ is the effective wavelength of the microwaves in each of the dielectric layers 76. In addition, the thickness of each of the dielectric layers 76 is preferably 1 to 5 mm.

Each of the dielectric layers 76 may be air (vacuum) or may be a dielectric material such as dielectric ceramics or resin. As the dielectric material, it may be possible to use, for example, quartz, ceramics, a fluorine-based resin such as polytetrafluoroethylene or the like, and a polyimide-based resin. In the case where the plasma processing apparatus 1 using a 300 mm wafer W to be processed, the wavelength of the microwaves of 860 MHz, the microwave retardation member 72B, the microwave transmitting plate 73B and alumina having a dielectric constant of about 10 used as the dielectric material in the slots 75b, it may be possible to use an air layer (vacuum layer) as each of the dielectric layers 76.

In this way, in the present embodiment, the dielectric layers 76 are provided in a mutually-separated state under the slots 75b so as to correspond to the respective slots 75b. As a result, a single loop magnetic field can be generated in each of the dielectric layers 76 by the microwaves radiated from each of the slots 75b, whereby a magnetic field loop corresponding to each of the dielectric layers 76 is formed in the microwave transmitting plate 73B. It is therefore possible to prevent the occurrence of a magnetic field coupling in the microwave transmitting plate 73B. Thus, it is possible to prevent the advent of a plurality of surface wave modes due to the occurrence or non-occurrence of a magnetic field loop in the microwave transmitting plate 73B. This makes it possible to realize stable plasma processing free from mode jump.

The interior of the slots 75a and 75b of the slot antenna portions 74A and 74B may be kept in a vacuum. However, it is preferred that the interior of the slots 75a and 75b are filled with a dielectric material. By filling the slots 75a and 75b with the dielectric material, the effective wavelength of the microwaves becomes shorter and the thickness of the slots 75a and 75b can be made small. As the dielectric material filled in the slots 75a and 75b, it may be possible to use, for example, quartz, ceramics, a fluorine-based resin such as polytetrafluoroethylene or the like, and a polyimide-based resin.

In addition, the microwave retardation members 72A and 72B, which have a dielectric constant larger than that of a vacuum, may be composed of, for example, quartz, ceramics such as alumina or the like, or a synthetic resin such as a fluorine-based resin, a polyimide-based resin or the like. Since the wavelength of the microwaves becomes longer in a vacuum, the microwave retardation members 72A and 72B have a function of shortening the wavelength of the microwaves, which results in reducing the size of the antenna. The phase of the microwaves varies depending on the thickness of the microwave retardation members 72A and 72B. Thus, by adjusting the phase of the microwave depending on the thickness of the microwave retardation members 72A and 72B, it is possible to adjust the slots 75a and 75b to be positioned at antinodes of standing waves. As a result, it is possible to suppress generation of reflected waves in the slot antenna portions 74A and 74B and to increase the radiant energy of the microwaves radiated from the slots 75a and 75b. That is to say, the power of the microwaves can be efficiently introduced into the process container 2.

Similar to the microwave retardation members 72A and 72B, the microwave transmitting plates 73A and 73B may be composed of, for example, quartz, ceramics such as alumina or the like, or a synthetic resin such as a fluorine-based resin, a polyimide-based resin or the like.

With the microwave introduction parts 6A and 6B configured as described above, the microwaves transmitted via the tuner parts 63A and 63B reach the slot antenna portions 74A and 74B. And the, the microwaves are radiated into the internal space of the process container 2 from the slots 75a and 75b of the slot antenna portions 74A and 74B through the microwave transmitting plates 73A and 73B. At this time, in the peripheral region of the ceiling portion 11, the microwaves are radiated from the slots 75b, which are formed to have an annular shape as a whole. The microwave transmitting plate 73B is provided in an annular shape so as to cover the slots 75b. Thus, the microwave power uniformly distributed by the microwave retardation member 72B as described above can be evenly radiated from the respective slots 75b and can be circumferentially spread by the microwave transmitting plate 73B. Therefore, since it is possible to annularly form a uniform microwave electric field immediately below the microwave transmitting plate 73B, uniform surface wave plasma can be formed in the circumferential direction in the process container 2.

<Procedure of Plasma Processing>

The plasma processing using the plasma processing apparatus 1 may be performed, for example, by the following procedure. First, for example, a command is inputted from the user interface 82 to the process controller 81 so as to perform plasma processing in the plasma processing apparatus 1. Then, in response to the command, the process controller 81 reads the recipe stored in the memory part 83 or the computer-readable storage medium. Next, control signals are sent to the respective end devices of the plasma processing apparatus 1 (for example, the high-frequency bias power supply 25, the gas supply device 3a, the exhaust device 4, the microwave introduction device 5, etc.) so that plasma processing can be performed according to the conditions based on the recipe.

Next, the gate valve G is brought into an open state and the wafer W is loaded into the process container 2 through the gate valve G and the loading/unloading gate 12a by a transfer device (not shown). The wafer W is mounted on the mounting surface 21a of the mounting table 21. Then, the gate valve G is brought into a closed state and the interior of the process container 2 is depressurized and exhausted by the exhaust device 4. Subsequently, the rare gas and the process gas are introduced into the process container 2 at predetermined flow rates via the gas introduction part 15 by the gas supply mechanism 3. The internal pressure of the process container 2 is adjusted to a predetermined pressure by adjusting the exhaust amount and the gas supply amount.

Next, the microwave output part 50 generates microwaves to be introduced into the process container 2. The plurality of microwaves outputted from the distributor 54 of the microwave output part 50 is inputted to the plurality of antenna modules 61 of the microwave transmission part 60. At this time, in response to the control signal transmitted from the control part 8, in the antenna modules 61 respectively connected to the three tuner parts 63B arranged in the upper portion of the peripheral region of the ceiling portion 11, the phases of the microwaves transmitted from the respective antenna modules 61 are controlled by the phase shifters 62A so that they are different from each other. For example, when there are N antenna modules 61 for transmitting a plurality of microwaves radiated from a common microwave transmitting plate 73B having a ring shape, the phases are made different by 360 degrees/N. In the present embodiment, N=3. The phase shifters 62A of the three antenna modules 61 are adjusted so that the wavelength of the microwaves is shifted by 120 degrees. In this case, when the microwaves are sinusoidal waves represented by the following formula:

$$y = A \cdot \sin(\omega t + \alpha),$$

where A denotes the amplitude, ω to denotes the angular frequency, t denotes the time, and α denotes the phase, α is made different by 120 degrees. More specifically, when the three tuner parts for transmitting the microwaves radiated from the common microwave transmitting plate 73B are assumed as a tuner part 63B1, a tuner part 63B2 and a tuner part 63B3, the tuner part 63B1 controls the microwaves such that $y = A \cdot \sin(\omega t + 0°)$; the tuner part 63B2 controls the microwaves such that $y = A \cdot \sin(\omega t + 120°)$; and the tuner part 63B3 controls the microwaves such that $y = A \cdot \sin(\omega t + 240°)$. By making the phases of the microwaves radiated from the common microwave transmitting plate 73B different in this way, it is possible to effectively suppress the mode jump of surface wave plasma.

In each of the antenna modules 61, the microwaves propagate through the amplifier part 62 and the tuner parts 63A and 63B and reach the microwave introduction parts 6A and 6B. Then, the microwaves penetrate the microwave transmitting plates 73A and 73B from the slots 75a and 75b of the slot antenna portions 74A and 74B and are radiated into the space existing above the wafer W in the process container 2. In this manner, the microwaves are separately introduced into the process container 2 from each of the antenna modules 61.

As described above, the microwaves introduced into the process container 2 from a plurality of regions respectively form electromagnetic fields in the process container 2. As a result, the rare gas or the process gas introduced into the process container 2 is turned into plasma. Thus, a film forming process or an etching process is performed on the wafer W by the action of active species, for example, radicals or ions, existing in the plasma.

When a control signal for terminating the plasma processing is sent from the process controller 81 to the respective end devices of the plasma processing apparatus 1, the generation of the microwaves is stopped and the supply of the rare gas and the process gas is stopped. Thus, the plasma processing with respect to the wafer W is terminated. Next, the gate valve G is brought into an open state and the wafer W is unloaded by a transfer device (not shown).

<Operation>

As described above, in the plasma processing apparatus that introduces a plurality of microwaves, it is effective to use a large-sized microwave transmitting plate in order to cope with enlargement of the wafer W without unnecessarily increasing the number of microwave introduction regions. However, when the microwave transparent plate becomes larger, mode jump tends to occur. That is to say, only the microwave having a wavelength equal to an integral multiple of a half wavelength exists in the interior of the microwave transmitting member. Thus, mode jump does not occur when the diameter of the microwave transmitting plate is, for example, about 90 mm. However, when the diameter of the microwave transmitting plate is increased to, for example, about 390 mm, mode jump is likely to occur because multiple modes may be generated. Therefore, according to the plasma processing apparatus 1 of the present embodiment, in the phase shifters 62A of the three antenna modules 61, the phases of the microwaves radiated from the common microwave transmitting plate 73B are adjusted to be shifted by 120 degrees. By shifting the phases in this way, it becomes possible to periodically and locally generate surface wave plasma. Thus, the degree of freedom of spreading of plasma increases. As a result, the position of a node of a standing wave is not fixed and occurrence of mode jump can be suppressed. In addition, when the phases of the microwaves introduced from three locations are shifted by 120 degrees, the microwaves become a three-phase alternating current, which is excellent from the viewpoint of power efficiency.

As shown in FIG. 6, the above-described phase control is effective in the case of satisfying the relationship of $L \geq 3 \times \lambda$, where L is the outer circumference length of one common microwave transmitting plate 73B having a ring shape, A is the width (radial length) of a ring region, and $\lambda$ is the effective wavelength of the microwave propagating through the microwave transmitting plate 73B. The above-described phase control is more effective in the case of satisfying the relationship of $L \approx n \times 3\lambda$, (where n is a natural number). The above-described phase control may be preferably applied to a plasma processing apparatus having such a configuration. At this time, the effective wavelength $\lambda$ can be represented by the following equation:

$$\lambda \approx (\lambda_0/\varepsilon^{1/2})/\{1-[(\lambda_0/\varepsilon^{1/2})/\lambda_c]^2\}^{1/2},$$

where $\varepsilon$ is the relative permittivity of the dielectric material forming the microwave transmitting plate 73B, $\lambda_0$ is the wavelength of the microwave in vacuum, $\lambda_c$ is the cutoff frequency, and $\lambda_c = 2A$.

For example, when the wavelength of the microwave of 860 MHz is 349 mm, the material of the microwave transmitting plate 73B is quartz, and the width A of the ring region is 100 mm, the effective wavelength $\lambda$ of the microwave propagating through the microwave transmitting plate 73B is about 377 mm. In this case, the above-described phase control is effective when the outer circumference length of the microwave transmitting plate 73B exceeds 1132 mm.

<Modification>

Figure 7:
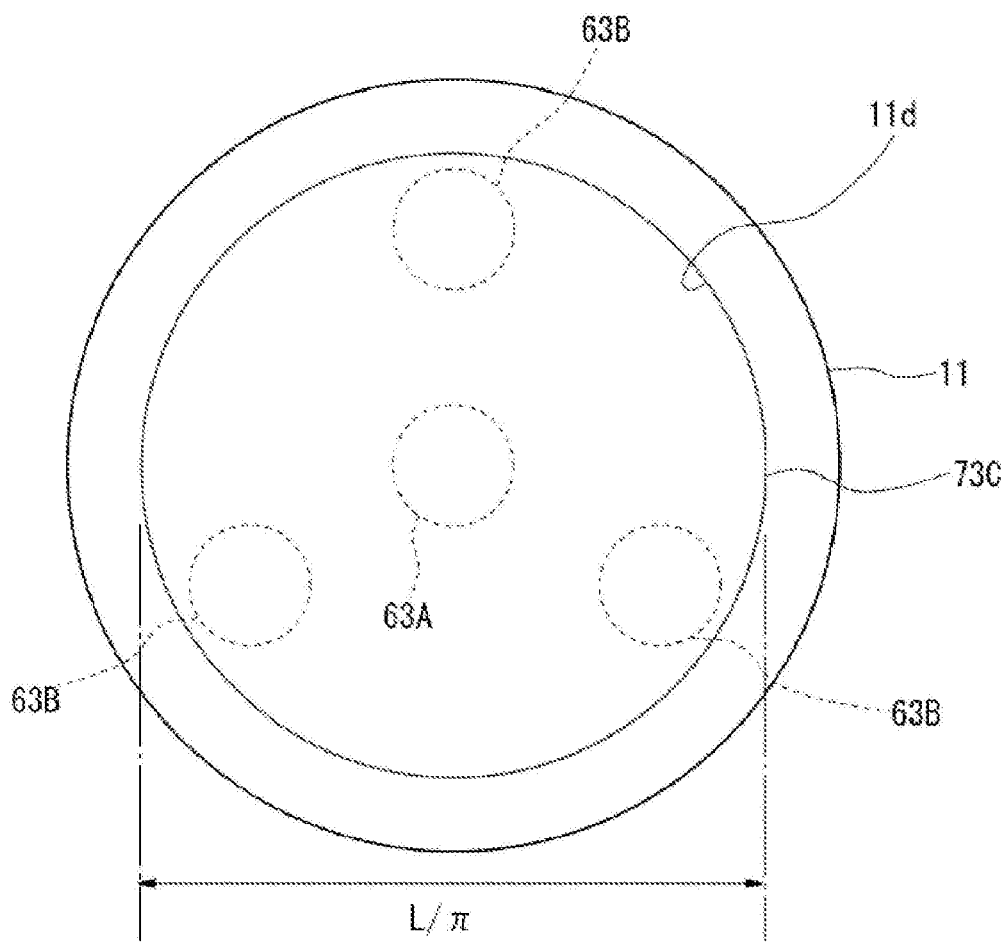
FIG. 7 is a plan view showing the configuration of a lower portion of a microwave introduction part according to a modification.

In the present embodiment, the common microwave transmitting plate for introducing the microwaves transmitted from the antenna modules 61 is not necessary to have a ring shape. For example, as shown in FIG. 7, a disc-shaped microwave transmitting plate 73C may be used instead of the ring-shaped microwave transmitting plate 73B. Even in this case, the above-described phase control is valid preferably in the case of satisfying the relationship of $L \geq 3\lambda$, where L is the outer circumference length of the microwave transmitting plate 73C and $\lambda$ is the effective wavelength of the microwave propagating through the microwave transmitting plate 73C, more preferably in the case of satisfying the relationship of $L \approx n \times 3\lambda$, (where n is a natural number and $\lambda$ is found as described above).

It should be noted that the present disclosure is not limited to the above-described embodiment and may be diversely modified. For example, in the above-described embodiment, the semiconductor wafer is used as the workpiece. However, the present disclosure is not limited thereto. For example, other substrates such as an FPD (flat panel display) substrate represented as a substrate for a liquid crystal display, a ceramic substrate, and the like may be used as the workpiece.

In the above-described embodiment, the microwave introduction part 6A is provided in the central region of the ceiling portion 11. However, the microwave introduction part may not be provided in the central region of the ceiling portion 11.

In addition, the configurations of the microwave output part 50 and the microwave transmission part 60 and the like are not limited to the above-described embodiment.

According to the present disclosure in some embodiments, it is possible to effectively suppress occurrence of mode jump of plasma in a plasma processing apparatus using a large microwave transmitting member common to a plurality of microwaves introduced into a process container. Therefore, according to the present disclosure, it is possible to homogenize the processing for a workpiece, thereby improving the reliability of an electronic component such as a semiconductor device or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:
   a process container configured to accommodate a workpiece;
   a mounting table disposed inside the process container and provided with a mounting surface configured to support the workpiece;
   a microwave output part configured to generate microwaves and to distribute and output the microwaves to a plurality of paths;
   a microwave transmission part configured to transmit the microwaves outputted from the microwave output part into the process container via a plurality of transmission paths;
   a microwave introduction part configured to radiate the microwaves transmitted by the microwave transmission part inside the process container and including a plurality of microwave retardation members made of a dielectric material; and a controller configured to control the microwave output part and the microwave transmission part, wherein the microwave transmission part includes:

phase adjustment parts disposed in the respective transmission paths and configured to adjust phases of the microwaves; and tuners disposed in the respective transmission paths and configured to match impedance between the microwave output part and an interior of the process container, wherein the microwave introduction part includes:

a conductive member constituting a ceiling portion of the process container and having a first recess formed in a peripheral region of the ceiling portion to face the mounting surface;

a plurality of slots forming a part of the conductive member and configured to radiate the microwaves transmitted via the microwave transmission part; and a first ring-shaped common microwave transmitting plate fitted to the first recess of the conductive member and configured to transmit and introduce the microwaves radiated through the plurality of slots into the process container, wherein the controller is configured to control the microwaves such that the phases of the microwaves become different from each other when the microwaves transmitted via the transmission paths are introduced from the first ring-shaped common microwave transmitting plate into the process container, wherein the microwave retardation members are disposed above the plurality of slots of the conductive member in an annular shape as a whole along an annular region including a region vertically overlapping with arrangement regions of the tuners, and wherein each of the tuners is configured to straddle between adjacent microwave retardation members of the plurality of microwave retardation members.

2. The apparatus of claim 1, wherein the first ring-shaped common microwave transmitting plate has a circular outer periphery and satisfies a relationship of $L \approx n \times 3\lambda$, where L is an outer circumference length of the microwave transmitting plate, $\lambda$ is an effective wavelength of the microwaves propagating inside the microwave transmitting plate and n is a natural number.

3. The apparatus of claim 1, wherein the controller is configured to make the phases of the microwaves different by 360 degrees/N where N is the number of the transmission paths configured to transmit the microwaves introduced from the first ring-shaped common microwave transmitting plate.

4. The apparatus of claim 1, wherein the controller is configured to make the phases of the microwaves different by 120 degrees when the number of the transmission paths configured to transmit the microwaves introduced from the first ring-shaped common microwave transmitting plate is three.

5. The apparatus of claim 1, wherein dielectric layers are separately provided between the plurality of slots and the microwave transmitting plate in a corresponding relationship with the plurality of slots.

6. The apparatus of claim 5, wherein the dielectric layers are air layers or dielectric material layers.

7. The apparatus of claim 1, further comprising a second disk-shaped microwave transmitting plate fitted to a second recess formed in a central region of the ceiling portion.

8. A plasma processing method for processing a workpiece using a plasma processing apparatus including:

a process container configured to accommodate a workpiece;

a mounting table disposed inside the process container and provided with a mounting surface configured to support the workpiece;

a microwave output part configured to generate microwaves and to distribute and output the microwaves to a plurality of paths;

a microwave transmission part configured to transmit the microwaves outputted from the microwave output part into the process container via a plurality of transmission paths;

a microwave introduction part configured to radiate the microwaves transmitted by the microwave transmission part into the process container and including a plurality of microwave retardation members made of a dielectric material; and a controller configured to control the microwave output part and the microwave transmission part, wherein the microwave transmission part includes phase adjustment parts disposed in the respective transmission paths and configured to adjust phases of the microwaves, and tuners disposed in the respective transmission paths and configured to match impedance between the microwave output part and an interior of the process container, wherein the microwave introduction part includes:

a conductive member constituting a ceiling portion of the process container and having a recess formed in a peripheral region of the ceiling portion to face the mounting surface;

a plurality of slots forming a part of the conductive member and configured to radiate the microwaves transmitted via the microwave transmission part; and a ring-shaped common microwave transmitting plate fitted to the recess of the conductive member and configured to transmit and introduce the microwaves radiated through the plurality of slots into the process container, wherein the microwaves are controlled such that the phases of the microwaves become different from each other when the microwaves transmitted via the transmission paths are introduced from the ring-shaped common microwave transmitting plate into the process container, wherein the microwave retardation members are disposed above the plurality of slots of the conductive member in an annular shape as a whole along an annular region including a region vertically overlapping with arrangement regions of the tuners, and wherein each of the tuners is configured to straddle between adjacent microwave retardation members of the plurality of microwave retardation members.

9. The method of claim 8, wherein the phases of the microwaves are made different by 360 degrees/N where N is the number of the transmission paths configured to transmit the microwaves introduced from the ring-shaped common microwave transmitting plate.

10. The method of claim 8, wherein the phases of the microwaves are made different by 120 degrees when the number of the transmission paths configured to transmit the microwaves introduced from the ring-shaped common microwave transmitting plate is three.

* * * * *